United States Patent [19]

Lou

[11] Patent Number: 5,759,906
[45] Date of Patent: Jun. 2, 1998

[54] PLANARIZATION METHOD FOR INTERMETAL DIELECTRICS BETWEEN MULTILEVEL INTERCONNECTIONS ON INTEGRATED CIRCUITS

[75] Inventor: Chine-Gie Lou, Hsinchu, Taiwan

[73] Assignee: Industrial Technology Research Institute, Hsin-Chu, Taiwan

[21] Appl. No.: 827,813

[22] Filed: Apr. 11, 1997

[51] Int. Cl.$^6$ ................................. H01L 21/28
[52] U.S. Cl. .................. 438/623; 438/624; 438/626; 438/627; 438/633; 438/639
[58] Field of Search .................. 438/623, 624, 438/626, 627, 633, 639, 692, 781, 782, 355, 391

[56] References Cited

U.S. PATENT DOCUMENTS

| | | | |
|---|---|---|---|
| 5,219,792 | 6/1993 | Kim et al. | 438/639 |
| 5,312,512 | 5/1994 | Allman et al. | 156/636 |
| 5,371,046 | 12/1994 | Liaw et al. | 438/624 |
| 5,393,708 | 2/1995 | Hsia et al. | 437/228 |
| 5,413,963 | 5/1995 | Yen et al. | 438/623 |
| 5,616,519 | 4/1997 | Ping | 438/633 |
| 5,663,108 | 9/1997 | Lin | 438/633 |

*Primary Examiner*—John Niebling
*Assistant Examiner*—Thomas G. Bilodeau
*Attorney, Agent, or Firm*—George O. Saile; Stephen B. Ackerman

[57] ABSTRACT

An improved method for making a planar intermetal dielectric layer (IMD) for multilevel electrical interconnections on ULSI circuits is achieved. The method involves forming metal lines on which is deposited a conformal PECVD oxide. A multilayer of spin-on glass, composed of at least four layers, is deposited and baked at elevated temperatures and long times after each layer to minimize the poisoned via problem on product with minimum feature sizes greater than 0.35 um. A multilayer of a low dielectric constant polymer can also be used to reduce the RC time delay on product having minimum feature sizes less than 0.35 um. After depositing a $SiO_2$ on the SOG, or depositing a Fluorine-doped Silicon Glass (FSG) on the low k polymer, the layer is partially chemical/mechanically polished to provide the desired more global planar IMD. This eliminates the necessity of polishing back the SOG or polymer, which is difficult to achieve with the current technologies. Via holes are then etched in the IMD, and a FSG insulating layer is deposited and etched back to form sidewall spacers in the via holes to prevent outgassing from the SOG or low k polymer, and the next level of metal interconnections are formed. The method can be repeated to achieve a multilevel of planar metal interconnections for ULSI circuits.

19 Claims, 5 Drawing Sheets

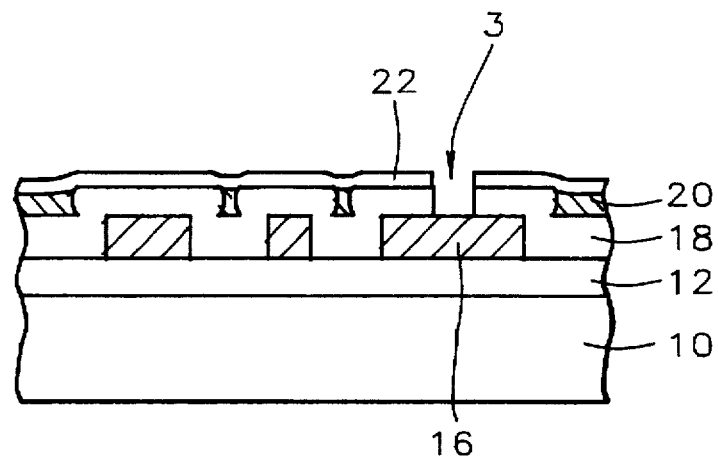
*FIG. 2 - Prior Art*
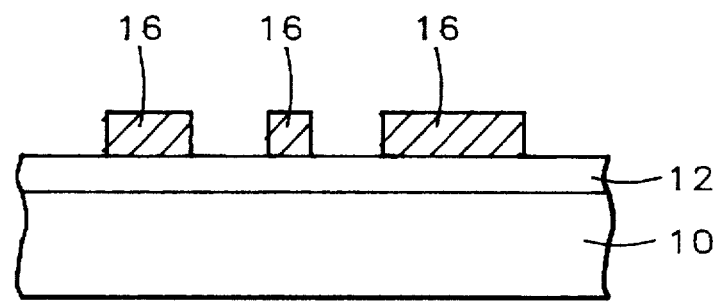
*FIG. 3*
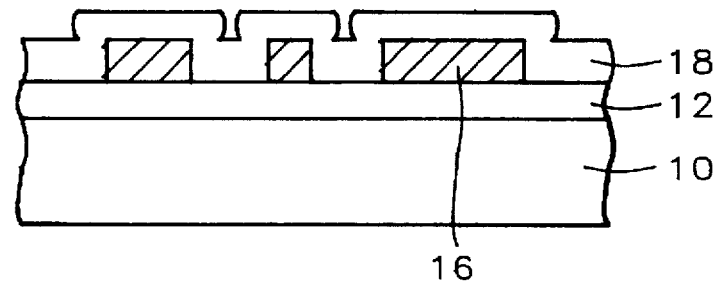
*FIG. 4*

PLANARIZATION METHOD FOR INTERMETAL DIELECTRICS BETWEEN MULTILEVEL INTERCONNECTIONS ON INTEGRATED CIRCUITS

BACKGROUND OF THE INVENTION

(1) Field of the Invention

The present invention relates to a method for fabricating integrated circuits on semiconductor substrates, and more specifically to a method for making planar intermetal dielectric (IMD) layers between the multilevel electrical interconnections on integrated circuits. The method utilizes a low dielectric constant (k) fluorine-doped spin-on glass and a Fluorine-doped Silicon Glass (FSG) using a non-etch-back technique.

(2) Description of the Prior Art

Integrated circuits fabricated on semiconductor substrates for Ultra Large Scale Integration (ULSI) require multilevels of metal interconnections for electrically interconnecting the discrete semiconductor devices on the semiconductor chips. In the more conventional method the different levels of interconnections are separated by layers of insulating material. These interposed insulating layers have etched via holes which are used to connect one level of metal to the next. Typically, the insulating layer is a silicon oxide ($SiO_2$) having a dielectric constant (relative to vacuum) of about 4.1 to 4.5. However, as the device dimensions decrease and the packing density increases, it is necessary to reduce the spacing between the metal lines in the interconnections to effectively wire up the integrated circuits. Unfortunately, as the spacing decreases, the intra- (on the same metal level) and interlevel (between metal levels) capacitances increase between metal lines when an insulating layer having the same dielectric constant is used, since the capacitance C is inversely proportional to the spacing d between the lines ($C = k e_o A/d$ where k is the dielectric coefficient, $e_o$ is the permittivity in a vacuum, A is the area, and d is the spacing between lines). Therefore, it is very desirable to minimize the dielectric constant k in the insulator (dielectric) between the conducting lines to reduce the C, and therefore the RC time delay, and thereby increase the performance of the circuit (frequency response) since the signal propagation time in the circuit is adversely affected by the RC delay time, where R is the resistance of the metal line, and C is the inter- and/or the intralevel capacitance mentioned above. The dependence of delays due to the gate delays and the interconnects is shown in FIG. 1. As shown in FIG. 1, the curve 1 shows the time delay in nanoseconds of the field effect transistors (FET) gate minimum feature size (channel length) in micrometers (gate delay) and the curve 2 shows the interconnect delay as a function of the minimum feature size (line spacings). It is clearly seen that as the minimum feature size is reduced below 1.0 micrometers (um), the interconnection delay (curve 2) becomes the predominant circuit delay.

One approach to minimize these RC time delays is to use a good electrical conductor for the interconnections, such as replacing aluminium with copper to reduce resistance R, and in addition to use an insulating material that has a lower dielectric constant (k), such as an organic material, to reduce the capacitance C between lines.

Some typical in organic and organic low k materials that can be used to reduce the capacitance is shown in Table I and is compared to an undoped plasma oxide, such as undoped chemical vapor deposited (CVD) silicon oxide. Typically a fluorine-doped silicon oxide is also referred to as a fluorine-doped glass (FSG).

TABLE I

| | DIELECTRIC CONSTANT |
|---|---|
| INORGANICS | |
| PLASMA $SIO_2$ | 4.1–4.5 |
| FLUORINE-DOPED $SIO_2$ (FSG) | 3.5 |
| ORGANICS | |
| POLYIMIDE | 3.0–3.7 |
| POLYSILSEQUIOXANE (Si POLYMER) | 2.7–3.0 |
| BENZOCYCLOBUTENE (BCB) | 2.7 |
| PARYLENE N | 2.7 |
| FLUORINATED POLYIMIDE | 2.5 |
| PARYLENE F | 2.3 |
| AMORPHOUS TEFLON | 1.9 |

One prior-art method of forming the intermetal dielectric (IMD) layer is depicted in the schematic cross-sectional view in FIG. 2. FIG. 2 shows a substrate 10 on which is deposited an insulating layer 12 which electrically insulates semiconductor devices that are formed in and on the substrate 10. Contact openings are etched in layer 12 to the devices. Neither the devices or contact openings are depicted in the drawings to simplify the drawing and discussion. A first metal layer 16, such as Al/Cu is deposited and patterned by photoresist masking and etching. A chemical vapor deposited (CVD) silicon oxide ($SiO_2$) layer 18 is deposited over the metal lines to improve the adhesion and to protect the metal lines from the moisture in the low k polymer 20 which is deposited next to protect the metal lines 16 from the moisture that can corrode the metal lines. Typically a spin-on glass (SOG) or a low dielectric constant polymer 20 is spin coated and then etched back to the protective layer 18 to provide a SOG or low k intermetal dielectric (IMD) layer 20 that is essentially planar between the narrow spaced metal lines. A hard mask 22, composed of a low-temperature CVD oxide, is deposited and a photoresist mask (not shown) is then used to form the via holes 3 in the hard mask 22 and in the protective CVD layer 18. This prevents the SOG or low k polymer from outgassing in the via hole 3 that can erode the next level of metal in the via. Typically there are several problems associated with this structure. For example, the etch back does not provide a global planar surface, and using additional etch-back steps to planarize the layer complicates and makes more costly the manufacturing process. If chemical/mechanical polishing (CMP) is used, the polishing rate of SOG and low k polymers is slow (about 300–400 Angstroms/minute) and easily prone to scratching. There is still no commercially available good polishing method, and will take years to develop and implement into manufacturing. Also, it is difficult to control the CMP endpoint and can cause the SOG or low k polymer to dish (become concave) between the metal lines, which results in an undesirable, non-planar surface.

Several methods for planarizing a SOG on multilevel metals interconnections have been reported. For example, Allman et al., U.S. Pat. No. 5,312,512, describe a method for forming a planar SOG by depositing and then etching back the SOG to remove high portions. A thick encapsulating oxide layer is deposited and chemical/mechanically polished before the next level of metal is formed. Another method for making planar intermetal dielectric layers on closely spaced metal lines is described by Hsia et al., U.S. Pat. No. 5,393,708, in which a $TEOS/O_3$ oxide is deposited that more effectively fills the narrow recesses between the metal lines, and then a SOG is deposited, cured, and partially etched back to remove the SOG at its highest points, leaving portions in the lower regions on the substrate.

However there is a current demand for effective processes for making planar intermetal dielectric (IMD) layers on integrated circuits. And more specifically providing simple SOG/silicon oxide planar IMD layers for the current 0.35 um (minimum feature size) technologies, and for making planar IMD layers having low dielectric constants (k) for future 0.25 to 0.10 um technologies, while avoiding the need to chemical/mechanical polish (CMP) the SOG or low k polymers, and that also minimizes via poisoning.

SUMMARY OF THE INVENTION

A principal object of the present invention, by a first embodiment, is to provide a non-polished-back spin-on-glass (SOG) technology.

It is another object of this invention, by a second embodiment, to provide a non-polished-back insulator using low dielectric constant (k) materials, thereby reducing the RC time delays for integrated circuits.

Still another object of this invention is to provide a spin-on glass or low-dielectric polymers and fluorine-doped silicon glass (FSG) to further eliminate the poisoned via hole problem.

In accordance with the objects of this invention, a new method for forming planar intermetal dielectric layers which eliminates polishing back the spin-on glass and also provides low dielectric materials for reducing the RC delay times on submicron structures is described. The process begins by providing a semiconductor substrate having semiconductor devices made in and on the substrate surface. A first insulating layer is deposited over the semiconductor devices having contact openings to the semiconductor devices. A barrier layer such as titanium (Ti)/titanium nitride (TiN) or titanium tungsten (TiW) is deposited to prevent aluminum penetration into the shallow junctions of the devices. A first conductive layer, such as aluminum (Al) or aluminum copper (AlCu), is deposited over the first insulating layer and in the contact openings to make electrical contact to the semiconductor devices. The first conductive layer and metal barrier layer are then patterned to form first metal lines as interconnections for the devices. A second insulating layer, such as silicon oxide ($SiO_2$), is deposited by plasma enhanced chemical vapor deposition (PECVD) on the patterned first metal lines. For integrated circuits having minimum feature sizes greater than 0.35 um, a SOG multilayer can be used, and for minimum feature sizes less than 0.35 um, low dielectric materials, such as a polymer multilayer, can be used. In a first embodiment of this invention, a spin-on-glass (SOG) multilayer, composed of at least four layers, is deposited and sequentially baked after the deposition of each layer to minimize moisture outgassing in via holes that can cause via poisoning that can degrade the contacts and increase the contact resistance when the next level of metal patterns is formed. The SOG multilayer also provides a higher degree of planarity and a wider process window than the more conventional etch-back process. Electron beam curing is used to effectively pyrolyze the SOG at a relatively low temperature (150° to 250° C.) to form an inorganic glass. A third insulating layer is deposited on the spin-on-glass multilayer, and the third insulating layer is partially chemical/mechanically polished back to further globally planarize the surface. Via holes are etched through the third insulating layer, the spin-on-glass (SOG) multilayer, and the second insulating layer to the first metal lines. A High-Density Plasma-Fluorine-doped Silicon oxide Glass (HDP-FSG) is deposited and anisotropically etched back to form sidewall spacers on the via hole sidewalls which prevents outgassing of the SOG that can cause corrosion of the next level of metal. A second conductive layer, such as Al or Al/Cu, is deposited on the third insulating layer and in the via holes, and is then patterned to form the next level of metal interconnections.

By the method of a second embodiment, a multilayer composed of at least four low dielectric constant (k) polymer (hereafter referred to as low k polymer) layers can be used in place of the spin-on-glass multilayer. Each low k polymer layer is baked after spin coating. The third insulating layer is composed of a low k silicon glass, such as a fluorine-doped silicon glass (FSG). The FSG is then partially chemical/mechanically polished back to form a globally planar surface. The remaining process steps are similar to the first embodiment, in which via holes are etched in the FSG, the low k polymer multilayer, and the second insulating layer down to the first metal lines. A High-Density Plasma-Fluorine-doped Silicon oxide Glass (HDP-FSG) is deposited and anisotropically etched back to form sidewall spacers on the via hole sidewalls which prevents outgassing from the polymer that can cause corrosion of the next level of metal. A second conductive layer is deposited and patterned to form the next level of electrical interconnections.

BRIEF DESCRIPTION OF THE DRAWINGS

The objectives and other advantages of this invention are best understood with reference to the preferred embodiments and drawings in the figures.

FIG. 2 shows a schematic cross-sectional view of a conventional prior art patterned first conductive layer having a spin-on glass (SOG), or a low k polymer that is chemical/mechanically polished back, and then having an insulating layer, such as a chemical vapor deposited (CVD) silicon oxide.

FIGS. 3 through 9 are schematic cross-sectional views showing the sequence of process steps, by a first embodiment of this invention, for making planar metal interconnections using an improved multilayer of SOG and a partially chemical/mechanically polished insulating layer.

DESCRIPTION OF THE PREFERRED EMBODIMENTS

Figure 1:
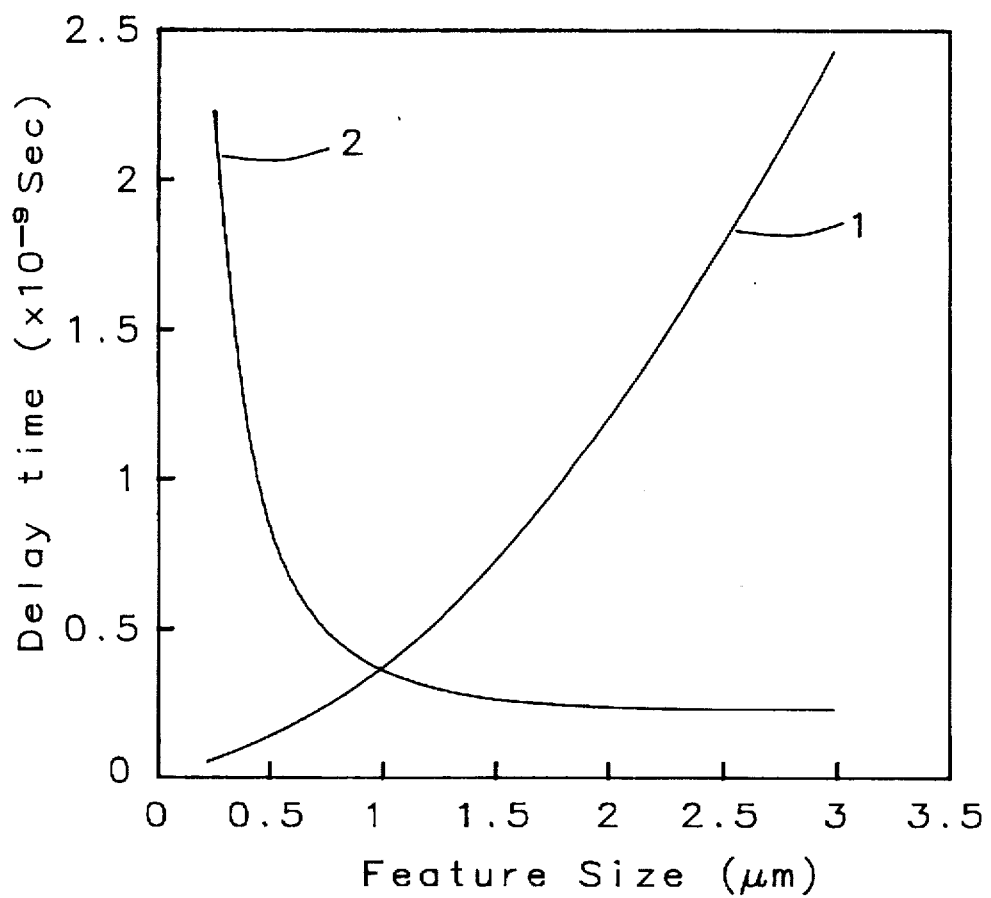
FIG. 1 is a graph showing the dependence of the RC time delay for metal interconnections and for the intrinsic gate electrode delays of an FET as a function of minimum feature size in micrometers (um).

The present invention relates to a method for fabricating a planar intermetal dielectric using a non-polish back technology to provide a planar multilevel metal structure. The method by the first embodiment minimizes via poisoning using SOG, while a second embodiment provides a method using low k materials to reduce the RC time delays for the interconnecting levels of metal. For integrated circuits having minimum feature sizes greater than 0.35 um, a SOG multilayer can be used, and for minimum feature sizes less than 0.35 um, low dielectric materials, such as polymers can be used.

Referring first to FIG. 3, the process begins by providing a semiconductor substrate 10, such as a single-crystal silicon on which are formed semiconductor devices. The devices are not shown in the Figs. to simplify the drawings and the discussion. For example, the method can be applied to integrated circuits having devices such as field effect transistors (FETs), bipolar transistors, and the like made in and on the substrate surface. A first insulating layer 12 is deposited over the substrate 10 having the semiconductor devices. Preferably the first insulating layer is composed of a silicon oxide ($SiO_2$) and is deposited by low pressure chemical vapor deposition (LPCVD), and is deposited using a reactant gas such as tetraethosiloxane (TEOS) and oxygen ($O_2$). Preferably layer 12 is deposited to a thickness of between about 5000 and 10000 Angstroms. Layer 12 serves as the polysilicon-metal interlevel dielectric (PMD) that provides electrical insulation of the devices from the level of metal interconnections that are made next. Contact openings (not shown in the Figs.) are etched in the first insulating layer 12 to form contacts to the devices, such as the source/drain contact areas and gate electrodes of FETs, or to the emitter, base, and collector areas of bipolar devices. The contacts can be etched, for example, by high-density plasma (HDP) etching in an etchant gas such as trifluoromethane ($CHF_3$), which selectively etches the oxide to the silicon substrate 10. A barrier layer, which is not explicitly depicted in the Figs., is deposited over the first insulating layer 12 and in the contact openings. The barrier layer, typically composed of titanium (Ti)/titanium nitride (TiN) or titanium tungsten (TiW) is used to prevent aluminum penetration into the shallow junctions of the devices and to improve adhesion. A first conductive layer 16 is now deposited, and is patterned to form the first level of metal interconnections that extend over the contact openings and contact the semi-conductor devices. Layer 16 is typically composed of a metal having a high electrical conductivity. For example, aluminum (Al) or aluminum copper (AlCu) can be used. Typically the Al or Al/Cu can be deposited by physical vapor deposition (PVD) such as by electron-beam or sputter deposition, and is deposited to a thickness of between about 4000 and 6000 Angstroms. Alternatively, CVD Al can be deposited to fill high-aspect-ratio contact openings. Next, the first conductive layer 16 and barrier layer (not shown) are patterned using conventional photolithographic techniques and anisotropic plasma etching. The etching can be carried out in a reactive ion etcher (RIE) or high-density plasma (HDP) etcher using a gas mixture containing a chlorine ($Cl_2$) species.

Referring to FIG. 4, a second insulating layer 18 is deposited over the patterned first metal layer 16. Layer 18 is preferably composed of an undoped oxide, such as silicon oxide ($SiO_2$). Layer 18, which serves as part of the intermetal dielectric (IMD) layer, is deposited by a low-temperature method, such as plasma-enhanced chemical vapor deposition (PECVD) at a temperature range of between about 300° and 450° C., using a reactant such as TEOS, and is deposited to a thickness of between about 500° and 2500° Angstroms.

Figure 5:
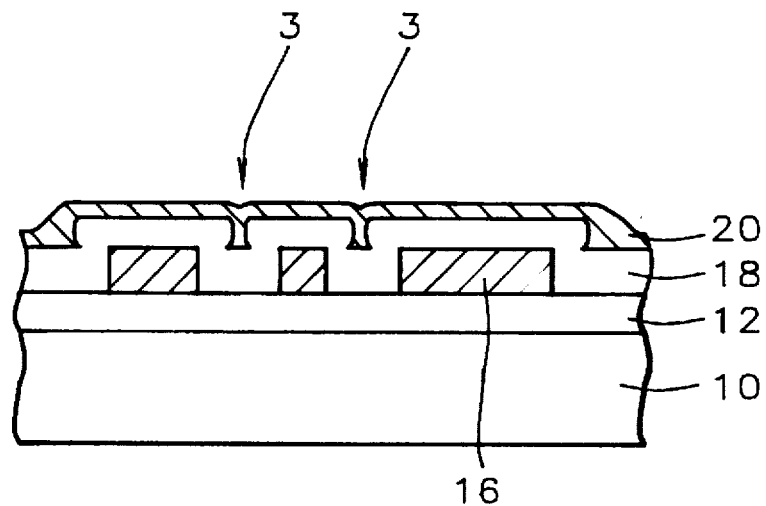

Referring now to FIG. 5, and by the method of a first embodiment of this invention, a spin-on glass (SOG) multilayer 20, composed of at least four layers, is deposited over the second insulating layer 18 filling the regions 3 between the metal lines 16 formed from the patterned first conductive layer. Preferably the SOG is siloxane, such as Type 211 manufactured by Allied Signal of U.S.A. To achieve a more planar surface and to minimize outgassing, the SOG is deposited in at least four layers which are baked at three increasing temperatures after each layer is deposited. Referring to TABLE III, the method of forming the SOG by this invention is given in detail in row 2, and compared to the conventional method in row 1. Each of the four layers of the SOG multilayer 20 is deposited to a thickness of between about 900 and 1100 Angstroms, and more specifically to a thickness of 1000 Angstroms, to provide a total SOG multilayer thickness of between about 3600 and 4400 Angstroms, and more specifically having a total thickness of 4000 Angstroms. Each layer is baked at progressively higher temperatures of between about 120 and 140° C. for about 2 minutes, and then at a second temperature of between about 180° and 220° C. for about 2 minutes, and at a third temperature of between about 280° and 310° C. for about 2 minutes. More specifically the SOG is baked at respective temperatures of 130°, 200°, and 290° C. The more conventional method (shown in row 1) uses two spin coatings of 2000 Angstroms thickness each, and is baked at increasing temperatures of 80°, 150°, and 250° C. as shown in col. 2, each for 1 minute as shown in col. 3. The method of this invention using the thinner SOG layers and the higher bake temperatures significantly reduces the moisture outgassing, and minimizes the via poisoning when the next level of metal is deposited and patterned forming contacts in the via holes. Also, the method provides a more level SOG layer 20.

TABLE III

SOG (Siloxane)

| rows\ | Col. 1 Number of Coatings (Total 4K A) | Col. 2 Bake Temp. °C. | | | Col. 3 Bake Time Minutes |
|---|---|---|---|---|---|
| | | 1 | 2 | 3 | |
| 1 Conventional | 2 | 80, | 150, | 250 | 1 |
| 2 Invention | 4 | 130, | 200, | 290 | 2 |

Electron-beam curing is then used to effectively pyrolyze the SOG at a relatively low temperature (150° to 250° C.) to form an inorganic glass and further reduce the $H_2O$ outgassing in the via holes.

Figure 6:
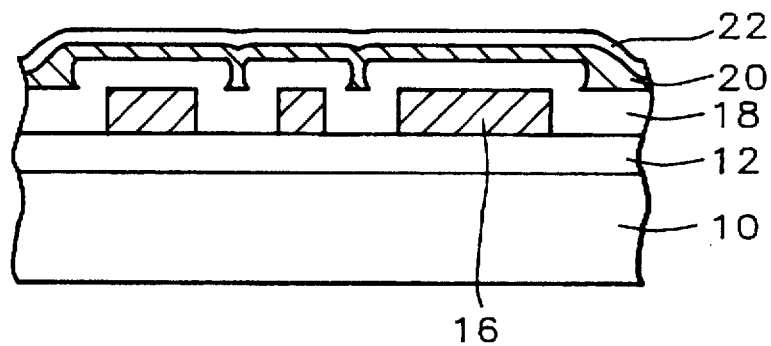

Referring now to FIG. 6, a third insulating layer 22 is deposited on the spin-on-glass multilayer 20, and the third insulating layer is partially chemical/mechanically polished (CMP) back to further globally planarize the surface. The SOG multilayer and partial CMP of the third insulating layer 22 provides a wider processing window than the more conventional polish-back process of the SOG. Preferably layer 22 is deposited by PECVD using TEOS as the reactant gas and at a temperature of between about 300° and 450° C., and is deposited to a thickness of between about 7000 and 12000 Angstroms. Layer 22 is then polished back to a final thickness of between about 2000 and 6000 Angstroms.

Figure 7:
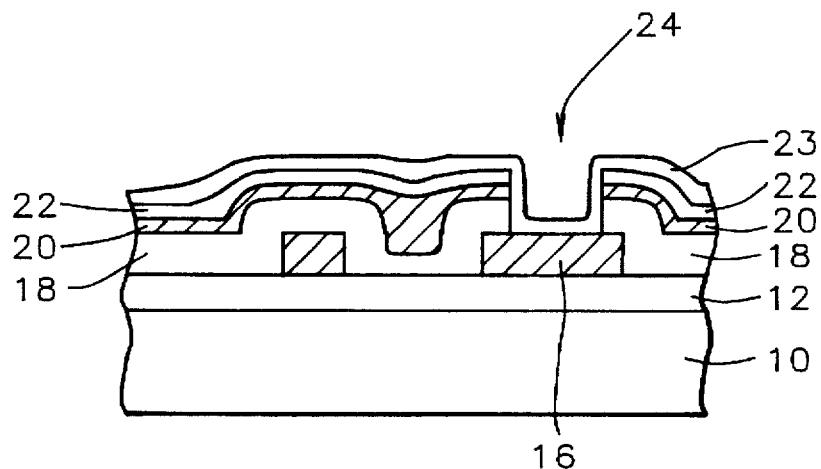
Figure 8:
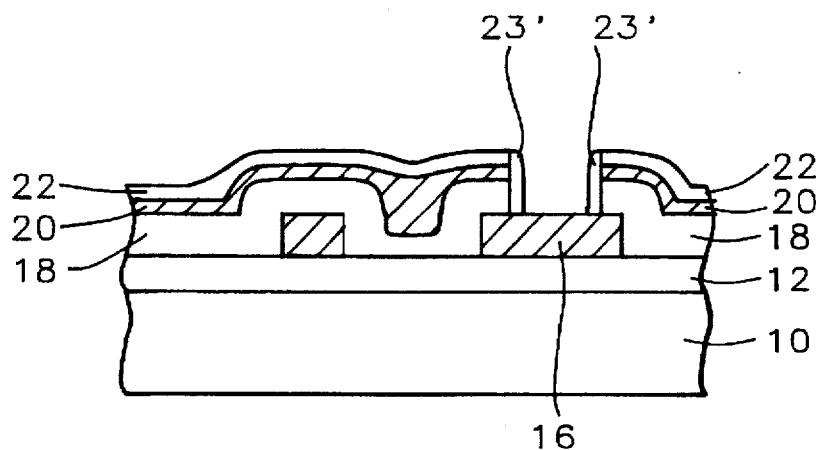

Referring next to FIG. 7, via holes 24 are etched through the third insulating layer 22, the spin-on-glass multilayer 20, and the second insulating layer 18 to the first metal lines 16. Next, a fourth insulating layer 23 is deposited over the third insulating layer 22 and in the via holes 24. Preferably layer 23 is a High-Density Plasma-Fluorine-doped Silicon oxide Glass (HDP-FSG). For example, the HDP-FSG layer 23 can be deposited using carbon tetrafluoride ($CF_4$), oxygen ($O_2$), and argon (Ar), and hydrogen ($H_2$) is later added to the gas mixture to remove excessive fluorine from the reaction mixture during deposition. Preferably the HDP-FSG layer is deposited to a thickness between about 300 and 700 Angstroms. Layer 23 is then anisotropically plasma etched back to form sidewall spacers 23' on the sidewalls of the via holes 24, as shown in FIG. 8, which by the method of this invention prevents outgassing from the SOG layer 20 in the via holes that can cause corrosion of the next level of metal contacts in the via holes. This HDP-FSG has a lower dielectric constant than conventional chemical vapor deposited oxides.

Figure 9:
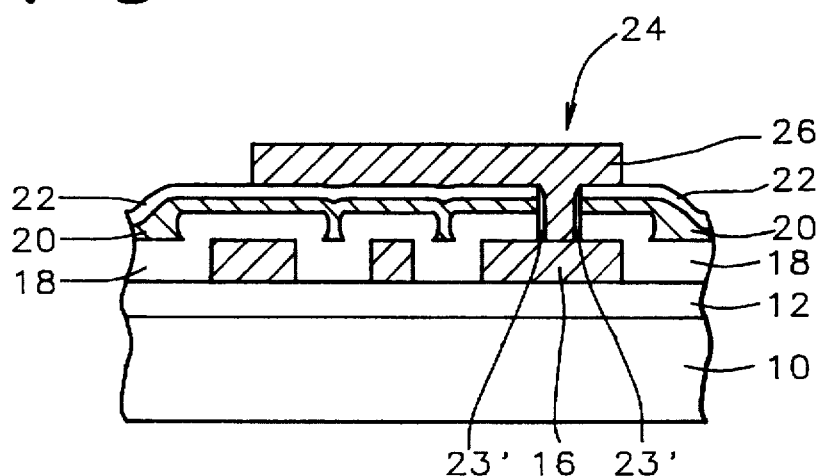

Referring now to FIG. 9, a second conductive layer 26, such as Al, Al/Cu, is deposited on the third insulating layer 22 and in the via holes 24, and is then patterned by conventional photolithographic means and anisotropic plasma etching to form the next level of metal interconnections. The thickness of metal layer 26 is between about 4000 and 6000 Angstroms. Further, the multilevel SOG, baked at higher temperatures for longer times, and the presence of the HDP-FSG sidewall spacers reduce the poisoned via problem, resulting in final yields of greater than 90%.

Although this first embodiment utilizes an undoped $SiO_2$ for the third insulating layer 22, it should also be understood that a Fluorine-doped Silicon Glass (FSG) can also be used for layer 22 to further reduce the dielectric constant and the RC delay time.

The intermetal dielectric non-etch-back method of this invention can be repeated to form additional levels of planar metal interconnections to complete the wiring for the integrated circuits.

Figure 10:
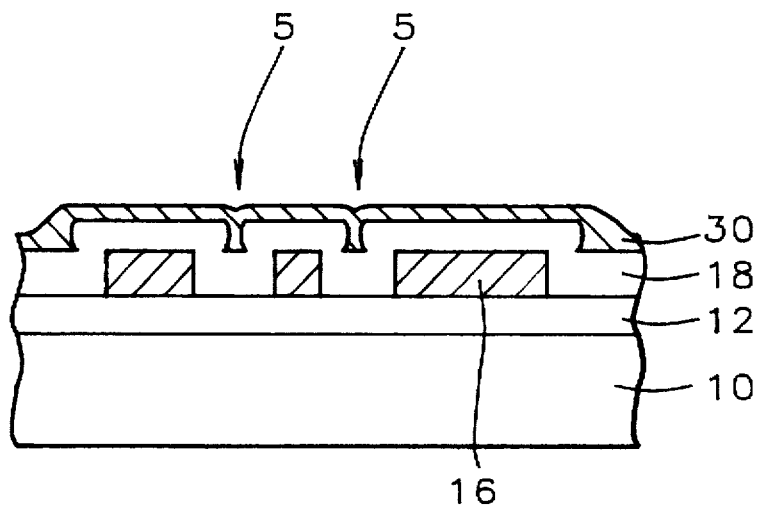
FIGS. 10 and 11 are schematic cross-sectional views showing the sequence of process steps, by a second embodiment of this invention, for making planar metal interconnections using an improved multilayer of low k polymer and a partially chemical/mechanically polished back (low k) Fluorine-doped Silicon Glass (FSG).
Figure 11:
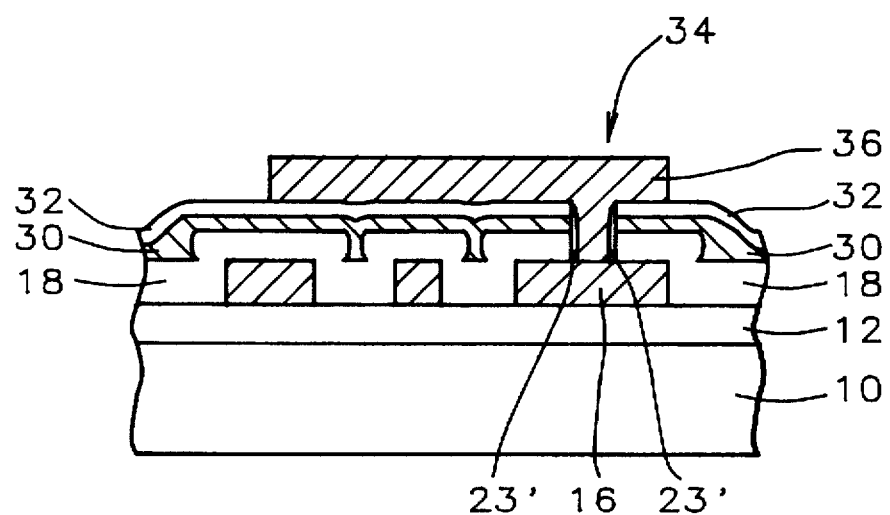

Referring to FIGS. 10 and 11, a second embodiment of the invention is now described for minimum feature sizes less than 0.35 um using a multilayer composed of at least four layers of a low dielectric constant (k) polymer (hereafter referred to as low k polymer), and a low k Fluorine-doped Silicon Glass (FSG) insulating layer. The method is identical to the process in the first embodiment up to but not including the deposition of the SOG, as shown in FIG. 4. Therefore all the elements labeled in FIG. 4 are the same for both the first embodiment and second embodiments.

Now as shown in FIG. 10, a low k polymer multi-layer 30, made up of at least four low dielectric constant (k) polymer layers, is deposited over the second insulating layer 18 filling the regions 5 between the metal lines 16 formed from the patterned first conductive layer. The preferred low k polymer is a polymer designated type FLARE(™) 418, manufactured by Allied Signal of U.S.A., and is synthesized from perfluorobiphenyl with aromatic bisphenols, which results in a fluorine-doped polymer having a low dielectric constant of 2.7. To achieve a more planar surface and to minimize outgassing, the low k polymer is deposited in at least four layers which are baked at three increasing temperature after each layer is deposited by spin coating. Referring to TABLE IV, the method of forming the low k polymer by the method of this invention is given in detail in row 2, and compared to the conventional method in row 1. Each of the four layers of the polymer multilayer 30 is deposited to a thickness of between about 1900 and 2100 Angstroms, and more specifically to a thickness of 2000 Angstroms, to provide a total polymer multilayer thickness of between about 7600 and 8400 Angstroms, and more specifically having a total thickness of 8000 Angstroms. Each layer is baked at progressively higher temperatures of between about 190° and 210° C. for about 2 minutes, then at a second temperature of between about 220° and 240° C. for about 2 minutes, and at a third temperature of between about 280° and 310° C. for about 2 minutes. More specifically each polymer layer is baked at respective temperatures of 200°, 230°, and 290° C. The more conventional method (shown in row 1) deposits the polymer using two spin coatings of 4000 Angstroms thickness each, and is baked at increasing temperatures of 180°, 200°, and 270° C. as shown in col. 2, for one minute at each temperature, as shown in col. 3. The method of this invention using the thinner polymer layers and the higher bake temperatures significantly reduces the moisture outgassing and minimizes the via poisoning when the next level of metal is deposited and patterned forming contacts in the via holes. Also, the method provides a more level polymer layer 30.

TABLE IV

Low k (Polymer)

| rows | Col. 1 Number of Coatings (Total 4K A) | Col. 2 Bake Temp. °C. | | | Col. 3 Bake Time Minutes |
|---|---|---|---|---|---|
| | | 1 | 2 | 3 | |
| 1 Conventional | 2 | 180, | 200, | 270 | 1 |
| 2 Invention | 4 | 200, | 230, | 290 | 2 |

Electron-beam curing is then used to effectively cure the low k polymer multilayer 30 at a relatively low temperature (150° to 270° C. ) to further reduce the $H_2O$ outgassing in the via holes.

Referring now to FIG. 11, a third insulating layer 32, composed of a low k Fluorine-doped Silicon Glass (FSG) is deposited on the polymer multilayer 30, and the FSG is chemical/mechanically polished back to further globally planarize the surface. The FSG is preferably deposited by high-density plasma chemical vapor deposition (HDP-CVD) using a high-density plasma (HDP) reactor and a reactant gas mixture using carbon tetrafluoride ($CF_4$), oxygen ($O_2$), and argon (Ar), in which hydrogen ($H_2$) is later added to the gas mixture to remove excessive fluorine from the reaction mixture during deposition. The FSG is preferably deposited to a thickness of between about 7000 and 12000 Angstroms. The FSG typically has a relative dielectric constant of between about 3.0 and 3.5. The third insulating layer composed of FSG, is then partially chemical/mechanically polished back to provide a more global planar surface. Preferably the FSG layer 32 is polished back to a final thickness of between about 2000 and 6000 Angstroms. The low dielectric constant k of the FSG further reduces the RC delay time between the different interconnecting metal levels.

Referring still to FIG. 11, the process is similar to the first embodiment. Via holes 34 are etched through the third insulating layer 32, the low k polymer multilayer 30, and the second insulating layer 18 to the first metal lines 16. Similar to the first embodiment, a fourth insulating layer 23 is deposited over the third insulating layer 32 and in the via holes 34. Preferably layer 23 is a high-density plasma fluorine-doped silicon oxide glass (HDP-FSG). For example, the HDP-FSG layer 23 can be deposited using carbon tetrafluoride ($CF_4$), oxygen ($O_2$), and argon (Ar), and hydrogen ($H_2$) is later added to the gas mixture to remove excessive fluorine from the reaction mixture during deposition. Preferably the HDP-FSG layer is deposited to a thickness between about 300 and 700 Angstroms. Layer 23 is then anisotropically plasma etched back to form sidewall spacers 23' on the sidewalls of the via holes 34, as shown in FIG. 11, which by the method of this invention prevents outgassing from the low k polymer multilayer 30 in the via holes that would otherwise cause corrosion of the next level of metal contacts in the via holes. A second conductive layer 36, such as Al or Al/Cu, is deposited on the third insulating layer 32 and in the via holes 34, and is then patterned by conventional photolithographic means and anisotropic plasma etching to form the next level of metal interconnections. The thickness of metal layer 36 is between about 4000 and 6000 Angstroms. The intermetal dielectric non-etchback method of this invention can also be repeated, as in the first embodiment, to form additional levels of planar metal interconnections with low RC time delays to complete the wiring for the integrated circuits.

While the invention has been particularly shown and described with reference to the preferred embodiments thereof, it will be understood by those skilled in the art that various changes in form and details may be made without departing from the spirit and scope of the invention.

What is claimed is:

1. A method for fabricating multilevel metal interconnections having low dielectric constant insulators on a substrate comprising the steps of:
   a. providing a semiconductor substrate having semiconductor devices in and on said substrate;
   b. depositing a first insulating layer over said devices, and further having contact openings in said first insulating layer for electrical contacts to said devices;
   c. forming a metal barrier layer on said insulating layer and in said contact openings;
   d. depositing a first conductive layer for contacting said devices in said contact openings;
   e. patterning said first conductive layer and said metal barrier layer to form first metal lines as interconnections for said devices;
   f. depositing a second insulating layer on said patterned first conductive layer;
   g. depositing a spin-on glass (SOG) multilayer composed of at least four layers, each layer of said multilayer being baked after spin coating, thereby forming an essentially planar surface over said first metal lines;
   h. curing said spin-on-glass multilayer;
   i. depositing a third insulating layer on said spin-on-glass multilayer, and partially chemical/mechanically polishing back said third insulating to form a more global planar surface;
   j. etching via holes through said third insulating layer, said spin-on-glass multilayer, and said second insulating layer to said first metal lines;
   k. depositing a fourth insulating layer and anisotropically plasma etching back to form sidewall spacers on the sidewalls of said via holes;
   l. depositing a second conductive layer on said third insulating layer and in said via holes;
   m. patterning said second conductive layer to form the next level of metal interconnections.

2. The method of claim 1, wherein said barrier layer is composed of titanium/titanium nitride and prevents aluminum from reacting with said devices.

3. The method of claim 1, wherein said second insulating layer is deposited by plasma enhanced chemical vapor deposition using tetraethosiloxane (TEOS) and having a thickness of between about 500 and 2500 Angstroms.

4. The method of claim 1, wherein each said layer of said spin-on-glass multilayer is a siloxane having a thickness of between about 900 and 2100 Angstroms and is baked sequentially at a temperature of between about 120° and 140° C. for about 2 minutes, a temperature of between about 180° and 220° C. for about 2 minutes, and at a temperature of between about 280° and 310° C. for about 2 minutes, thereby minimizing outgassing of moisture from said spin-on glass in said via holes and preventing via poisoning.

5. The method of claim 1, wherein said curing is carried out by electron beam curing at a temperature of between about 150° and 250° C. for about 7 to 10 minutes.

6. The method of claim 1, wherein said third insulating layer is deposited by plasma enhanced chemical vapor deposition (PECVD) using TEOS, and is deposited to a thickness of between about 7000 and 12000 Angstroms.

7. The method of claim 1, wherein said third insulating layer is a low dielectric constant insulator deposited by high-density plasma chemical vapor deposition (HDP-CVD) using a mixture of carbon tetrafluoride, oxygen, argon, and hydrogen and deposited to a thickness of between about 7000 and 12000 Angstroms, and having a dielectric constant of about 3.0 to 3.5.

8. The method of claim 1, wherein said spin-on glass is doped with fluorine to reduce the dielectric constant.

9. The method of claim 1, wherein said fourth insulating layer is composed of a high-density plasma fluorine-doped silicon oxide glass (HDP-FSG).

10. A method for fabricating multilevel metal interconnections having low dielectric constant insulators on a substrate comprising the steps of:
   a. providing a semiconductor substrate having semiconductor devices in and on said substrate;
   b. depositing a first insulating layer over said devices, and further having contact openings in said first insulating layer for electrical contacts to said devices;
   c. forming a metal barrier layer on said first insulating layer and in said contact openings;
   d. depositing a first conductive layer for contacting said devices in said contact openings;
   e. patterning said first conductive layer and said metal barrier layer to form first metal lines as interconnections for said devices;
   f. depositing a second insulating layer on said patterned first conductive layer;
   g. depositing a low dielectric polymer multilayer composed of at least four layers, each layer of said multilayer being baked after spin coating, thereby forming an essentially planar surface over said first metal lines;
   h. curing said low dielectric polymer multilayer;
   i. depositing a low dielectric constant insulator on said polymer multilayer and partially chemical/mechanically polishing back said low dielectric constant insulator to form a more global planar surface;
   j. etching via holes through said low dielectric constant insulator, said polymer multilayer, and said second insulating layer to said first metal lines;
   k. depositing a fourth insulating layer and anisotropically plasma etching back to form sidewall spacers on the sidewalls of said via holes;
   l. depositing a second conductive layer on said low dielectric constant insulator and in said via holes;
   m. patterning said second conductive layer to form the next level of metal interconnections.

11. The method of claim 10, wherein said barrier layer is composed of titanium/titanium nitride and prevents aluminum from reacting with said devices.

12. The method of claim 10, wherein said second insulating layer is deposited by plasma enhanced chemical vapor deposition (PECVD) using tetraethosiloxane (TEOS) and having a thickness of between about 400 and 2000 Angstroms.

13. The method of claim 10, wherein each layer of said low dielectric polymer multilayer is a polymer containing fluorine and each said layer is deposited to a thickness of between about 900 and 2100 Angstroms and is baked sequentially at a temperature of between about 190° and 210° C. for about 2 minutes, a temperature of between about 220° and 240° C. for about 2 minutes, and at a temperature of between about 280° and 310° C. for about 2minutes.

14. The method of claim 10, wherein said low dielectric polymer multilayer is doped with fluorine having a reduced dielectric constant of about 2.7.

15. The method of claim 10, wherein said curing is carried out by electron beam curing at a temperature of between about 150° and 270° C. for about 8 to 12 minutes.

16. The method of claim 10, wherein said low dielectric constant insulator is a fluorine-doped silicon glass (FSG) deposited by high-density plasma chemical vapor deposition (HDP-CVD) using a mixture of carbon tetrafluoride, oxygen, argon, and hydrogen, to a thickness of between about 7000 and 12000 Angstroms, and having a dielectric constant of about 3.0 to 3.5.

17. The method of claim 10, wherein said low dielectric polymer multilayer is comprised of a polymer selected from a group consisting of polyimide, polysilsequioxane, benzocyclobutene (BCB), parylene N, fluorinated polyimide, parylene F, and amorphous Teflon.

18. The method of claim 10, wherein said low dielectric polymer multilayer is synthesized from perfluorobiphenyl with aromatic bisphenols.

19. The method of claim 10, wherein said fourth insulating layer is composed of a high-density plasma fluorine-doped silicon oxide glass (HDP-FSG).

* * * * *